US006271113B1

(12) United States Patent
Yoon et al.

(10) Patent No.: US 6,271,113 B1

(45) Date of Patent: Aug. 7, 2001

(54) METHOD FOR FORMING WIRING IN SEMICONDUCTOR DEVICE

(75) Inventors: Tak Hyun Yoon; Wouns Yang; Sang Jun Choi, all of Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/472,161

(22) Filed: Dec. 27, 1999

(30) Foreign Application Priority Data

Apr. 15, 1999 (KR) ........................................ 99-13363

(51) Int. Cl.[7] ........................................ H01L 21/4763

(52) U.S. Cl. ........................ 438/618; 438/613; 438/696

(58) Field of Search ........................ 438/618, 613, 438/597, 611, 617, 647, 669, 696

(56) References Cited

U.S. PATENT DOCUMENTS 4,566,941 * 1/1986 Yoshida et al. .................... 156/643
5,227,628 * 7/1993 Okada et al. .................... 250/234
6,140,219 * 10/2000 Dennison .................... 438/618
6,150,256 * 11/2000 Furucava et al. .................... 438/618
6,153,504 * 11/2000 Shields et al. .................... 438/613

* cited by examiner

*Primary Examiner*—Matthew Smith
*Assistant Examiner*—V. Yevsikov
(74) *Attorney, Agent, or Firm*—Fleshner & Kim, LLP

(57) ABSTRACT

Method for forming a wiring in a semiconductor device having a cell array region and a peripheral region, which allows to form a micron pattern below a critical resolution of an exposure, including the steps of (1) forming a conduction layer and a sacrificial wiring layer on a substrate in succession, (2) selectively removing the sacrificial wiring layer to form a virtual wiring line having a sloped end portion, (3) forming sidewall insulating films at sides of the virtual wiring line excluding the sloped end portion, (4) removing the virtual wiring line entirely, (5) forming a mask layer on regions of the pad and peri region pads and other wirings are to be formed thereon, and (6) using the mask layer and the sidewalls in removing the conduction layer selectively, to form a micron pattern.

6 Claims, 8 Drawing Sheets

15
12
11
I I'

15
12
11
I I'

METHOD FOR FORMING WIRING IN SEMICONDUCTOR DEVICE

BACKGROUND OF THE INVENTION

1. Field of the Invention

The present invention relates a semiconductor device, and more particularly, to a method for forming a wiring in a semiconductor device, which allows to form a micron pattern below a critical resolution of an exposure.

2. Background of the Related Art

Even though a line width decreases the more as a device packing density of semiconductor devices becomes the higher, there has been a limitation in formation of a micron pattern only by an exposure due to the critical resolution in the photolithography.

A related art method for forming a wiring in a semiconductor device will be explained with reference to the attached drawings. FIG. 1 illustrates a plan view of a related art wiring in a semiconductor device, FIGS. 2*a* and 2*b* illustrate sections showing structures across lines I–I' and II–II' in FIG. 1 without a cap layer respectively, and FIGS. 3*a* and 3*b* illustrate sections showing structures across lines I–I' and II–II' in FIG. 1 with a cap layer, respectively.

Referring to FIG. 1, the semiconductor device is provided with a cell array region, and a pad and peri region. As can be known from FIG. 1, though the pad and peri region has a comparatively large line width, the cell array region has a relatively small line width.

The related art method for forming a wiring in a semiconductor device will be explained.

Referring to FIGS. 2*a* and 2*b*, a conduction layer 2 and a photoresist film 3 are deposited on a substrate 1 in succession for use as a wiring layer. And, the photoresist film 3 is subjected to patterning by exposure and development to form a wiring pattern mask. The wiring pattern mask is used in removing the conduction layer, selectively. Then, the photoresist film 3 is removed to form wiring in the cell array region and the pad and peri region, respectively.

Referring to in FIGS. 3*a* and 3*b*, if a cap layer is provided on the wiring layer, the conduction layer 2 for use as the wiring layer, a cap layer 4 and the photoresist film 3 are deposited on the substrate 1 in succession. And, the photoresist film 3 is subjected to patterning by exposure and development, to form a wiring pattern mask. The wiring pattern mask is used in removing the cap layer 4 and the conduction layer 2 selectively. Then, the photoresist film 3 is removed, to form wiring on the cell array region and the pad and peri region, respectively.

And, though not shown, sidewalls may be used for forming a micron pattern. However, this method forms unnecessary pattern because the sidewalls are formed in four sides.

Thus, the related art method for forming a wiring in a semiconductor device has the following problems.

First, if the wiring is formed by exposure, a micron pattern below the critical resolution of the exposure can not be formed.

Second, even if a micron pattern beyond the micron pattern formation limit of the present exposure is formed by applying the sidewall method, the formation of the sidewalls all around a sacrificial pattern causes formation of sidewalls even at unnecessary portions, that in turn causes to form patterns even at unnecessary portions.

SUMMARY OF THE INVENTION

Accordingly, the present invention is directed to a method for forming a wiring in a semiconductor device that substantially obviates one or more of the problems due to limitations and disadvantages of the related art.

An object of the present invention is to provide a method for forming a wiring in a semiconductor device, in which sidewalls are formed at desired portions only for forming a micron pattern below a critical resolution of exposure.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming a wiring in a semiconductor device having a cell array region and a peripheral region, includes the steps of (1) forming a conduction layer and a sacrificial wiring layer on a substrate in succession, (2) selectively removing the sacrificial wiring layer to form a virtual wiring line having a sloped end portion, (3) forming sidewall insulating films at sides of the virtual wiring line excluding the sloped end portion, (4) removing the virtual wiring line entirely, (5) forming a mask layer on regions of the pad and peri region pads and other wirings are to be formed thereon, and (6) using the mask layer and the sidewalls in removing the conduction layer selectively, to form a micron pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. FIGS. 4*a*~4*e* illustrate plan views showing the steps of a method for forming a wiring in a semiconductor device in accordance with a first embodiment of the present invention, FIGS. 5*a*~5*f* illustrate sections across lines I–I' in FIGS. 4*a*~4*e* respectively showing the steps of a method for forming a wiring in a semiconductor device in accordance with a first embodiment of the present invention, FIGS. 6*a*~6*c* illustrate sections across lines II–II' in FIGS. 4*a*~4*c* respectively showing the steps of a method for forming a wiring in a semiconductor device in accordance with a first embodiment of the present invention, and FIGS. 6*d*~6*e* illustrate sections across lines III–III' in FIGS. 4*d*~4*e* respectively showing the steps of a method for forming a wiring in a semiconductor device in accordance with a first embodiment of the present invention.

The method for forming a wiring in a semiconductor device in a case when a wiring structure in the present invention is the same with the related art will be explained.

Figure 1:
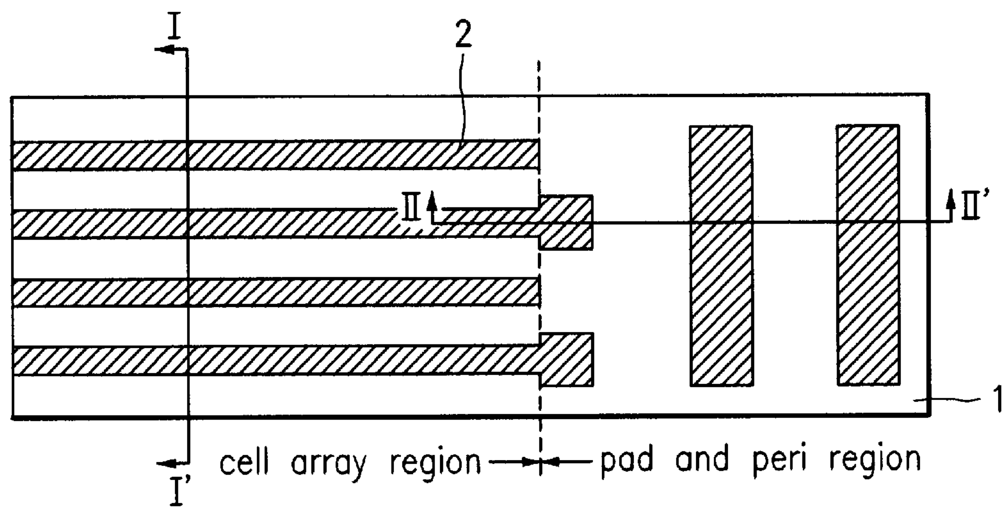
FIG. 1 illustrates a plan view of a related art wiring in a semiconductor device.
Figure 2A:
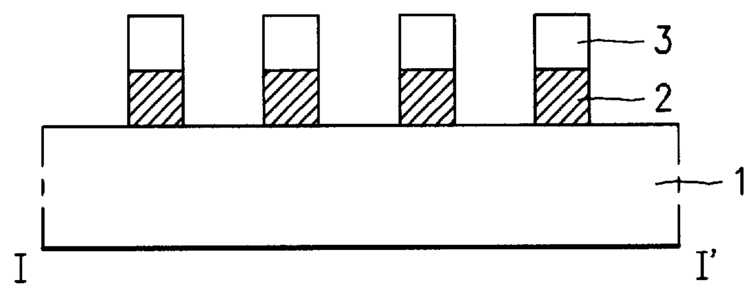
FIGS. 2*a* and 2*b* illustrate sections showing structures across lines I–I' and II–II' in FIG. 1 without a cap layer, respectively.
Figure 2B:
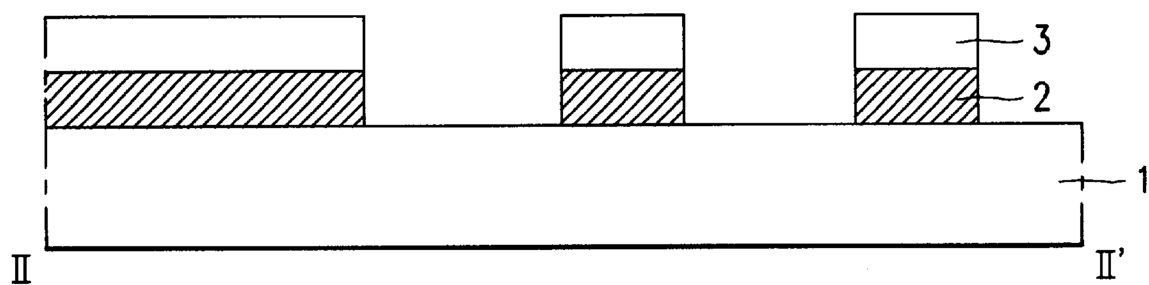
Figure 3A:
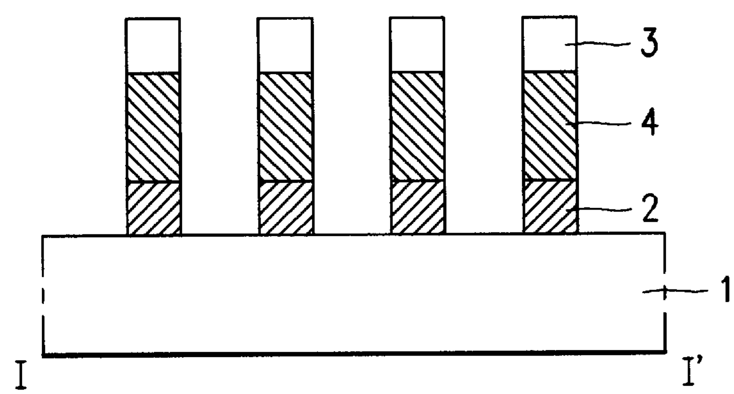
FIGS. 3*a* and 3*b* illustrate sections showing structures across lines I–I' and II–II' in FIG. 1 with a cap layer, respectively.
Figure 3B:
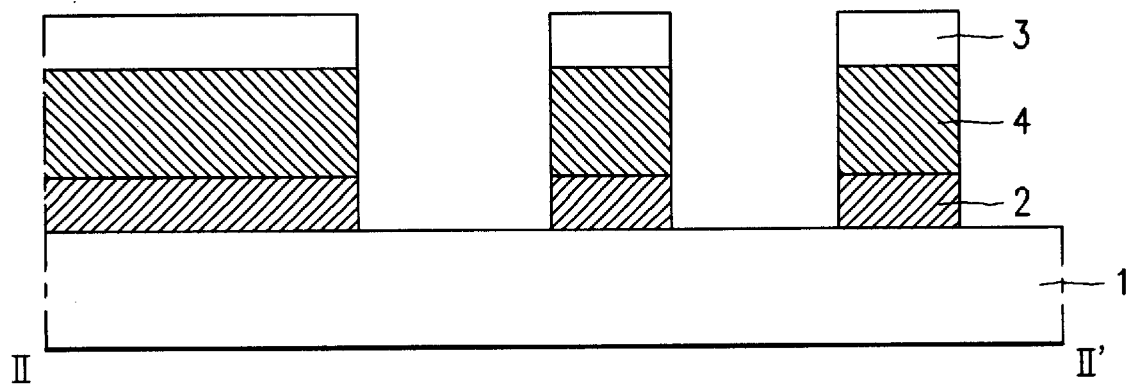
Figure 4A:
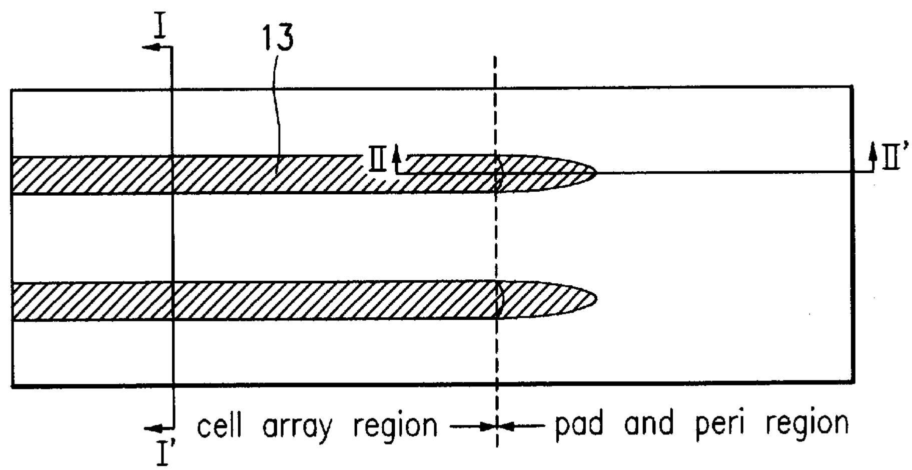
FIGS. 4*a*~4*e* illustrate plan views showing the steps of a method for forming a wiring in a semiconductor device in accordance with a first embodiment of the present invention.
Figure 4B:
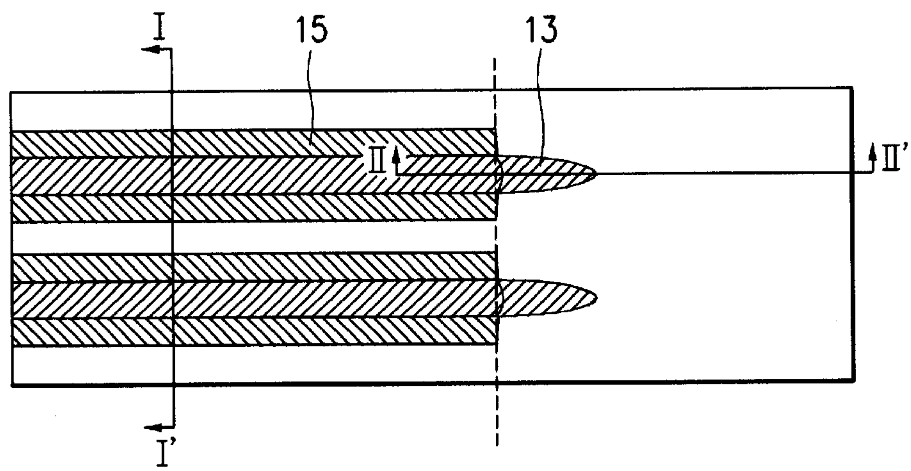
Figure 4C:
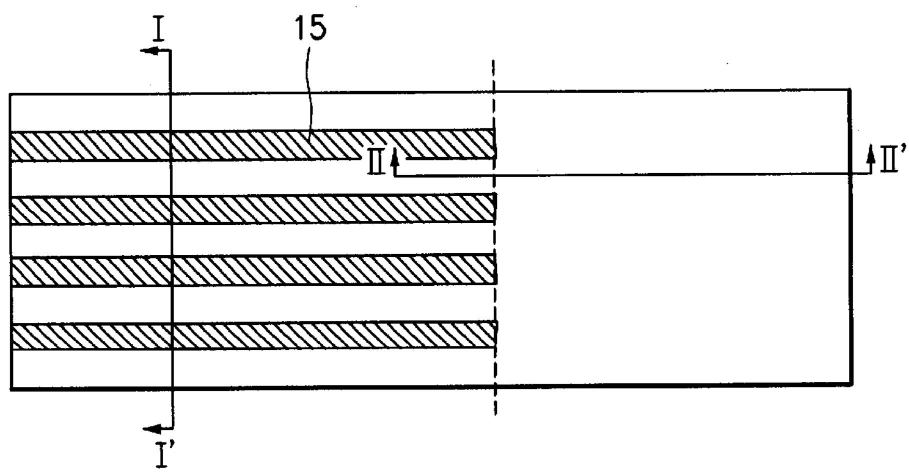
Figure 4D:
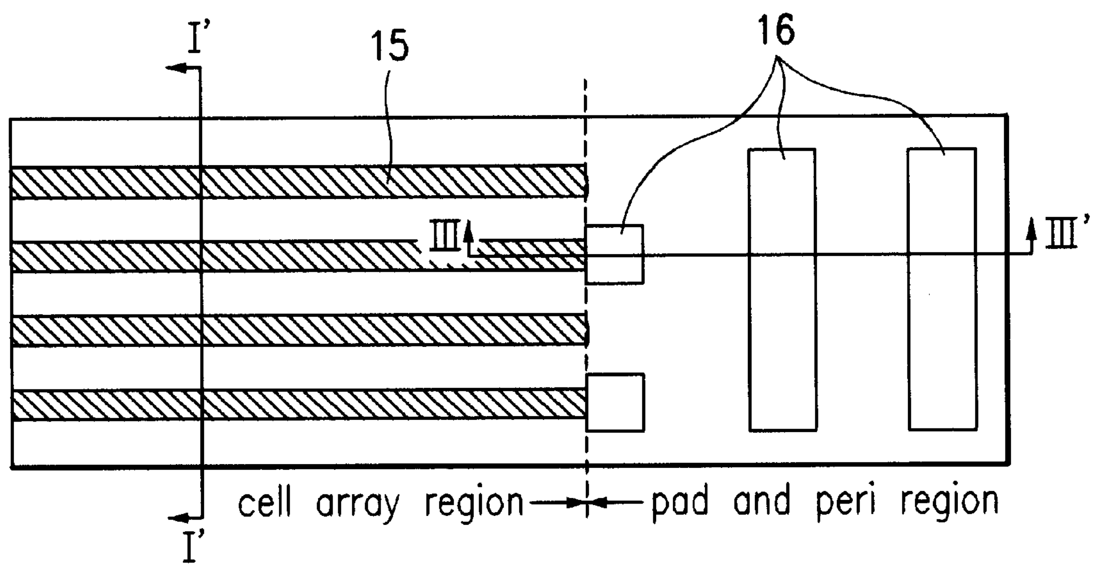
Figure 4E:
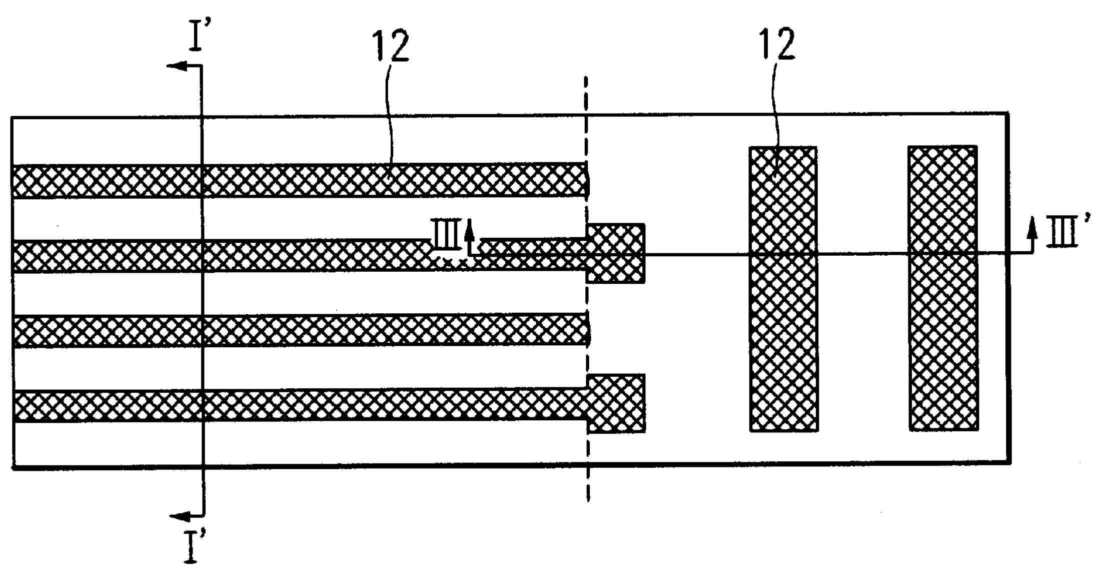
Figure 5A:
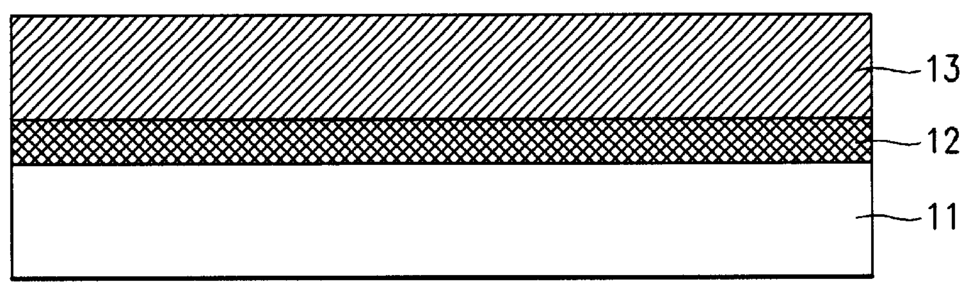
FIGS. 5*a*~5*f* illustrate sections across lines I–I' in FIGS. 4*a*–4*e* respectively showing the steps of a method for forming a wiring in a semiconductor device in accordance with a first embodiment of the present invention.
Figure 5B:
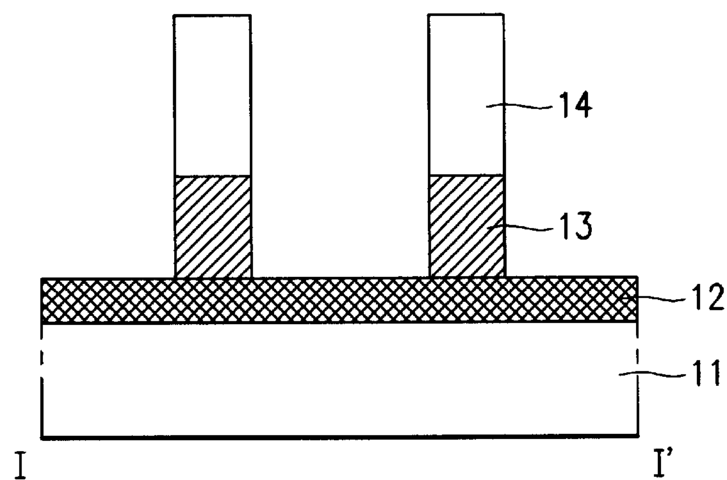
Figure 5C:
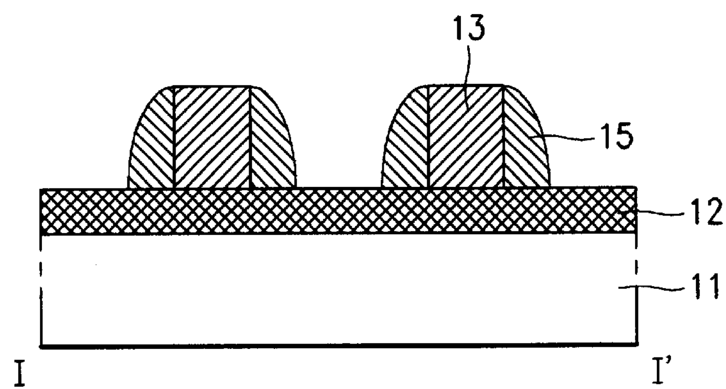
Figure 5D:
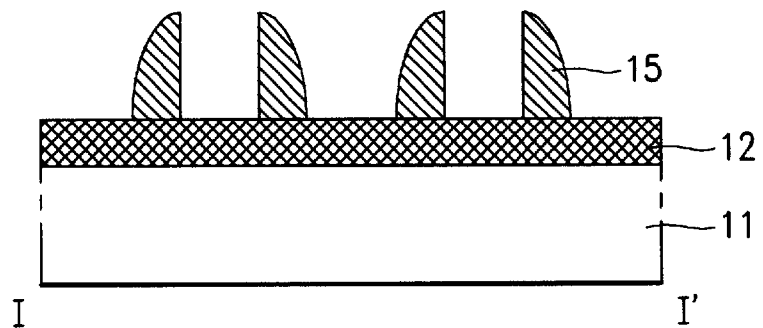
Figure 5E:
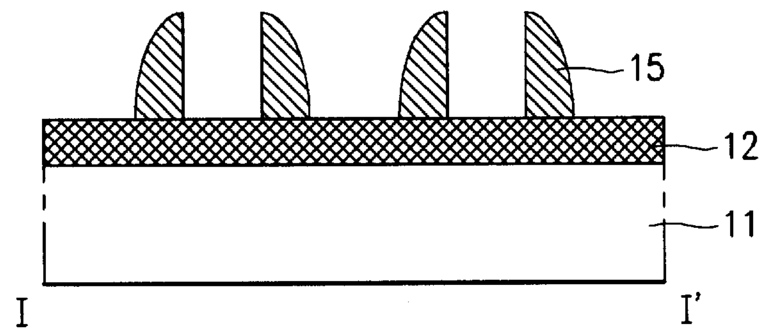
Figure 5F:
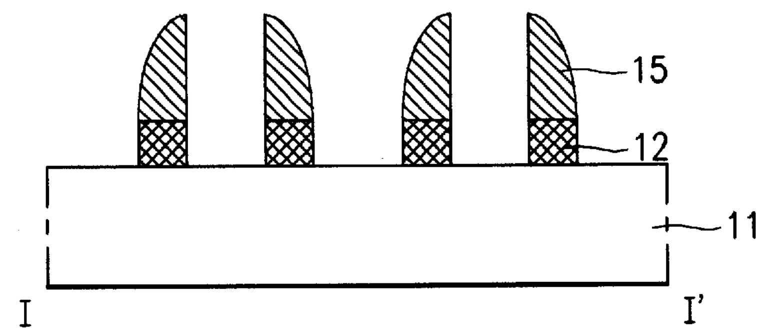
Figure 6A:
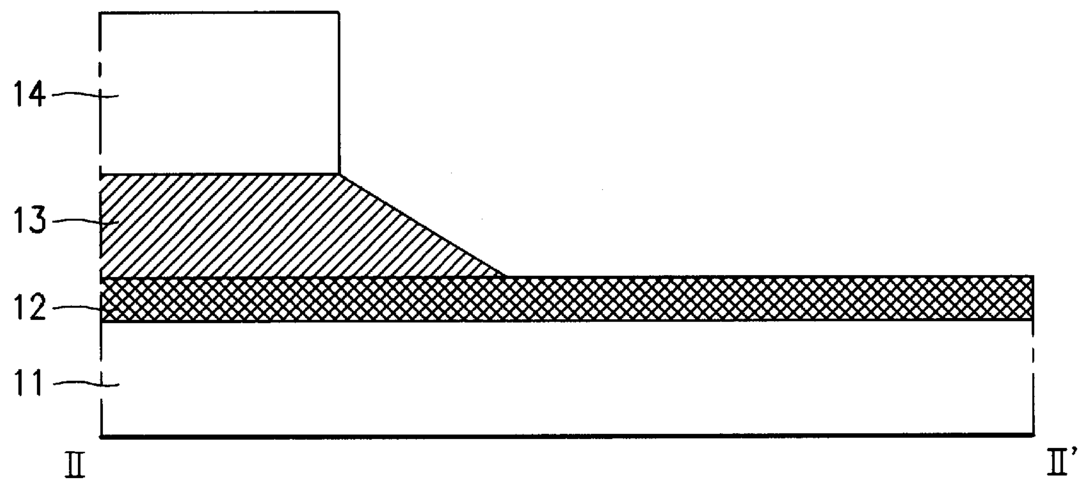
FIGS. 6*a*~6*c* illustrate sections across lines II–II' in FIGS. 4*a*~4*c* respectively showing the steps of a method for forming a wiring in a semiconductor device in accordance with a first embodiment of the present invention; and, FIGS. 6*d*~6*e* illustrate sections across lines III–III in FIGS. 4*d*~4*e* respectively showing the steps of a method for forming a wiring in a semiconductor device in accordance with a first embodiment of the present invention.
Figure 6B:
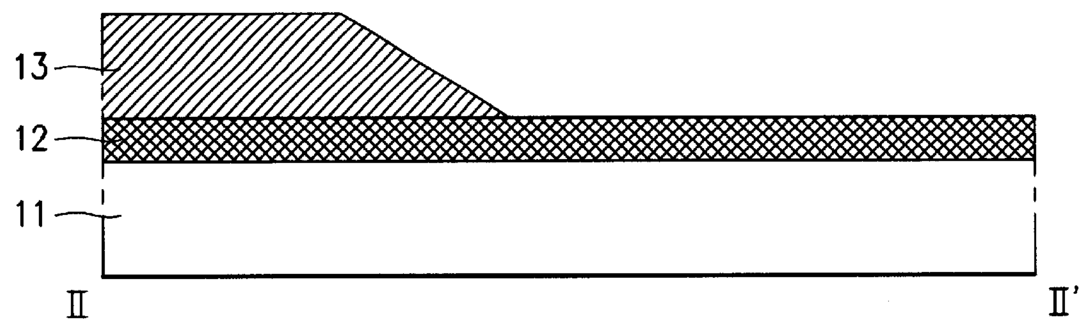
Figure 6C:
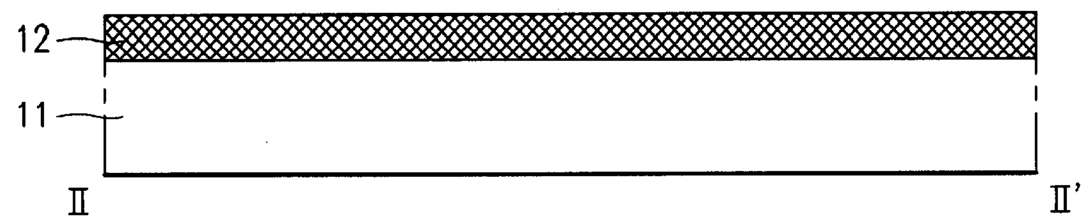
Figure 6D:
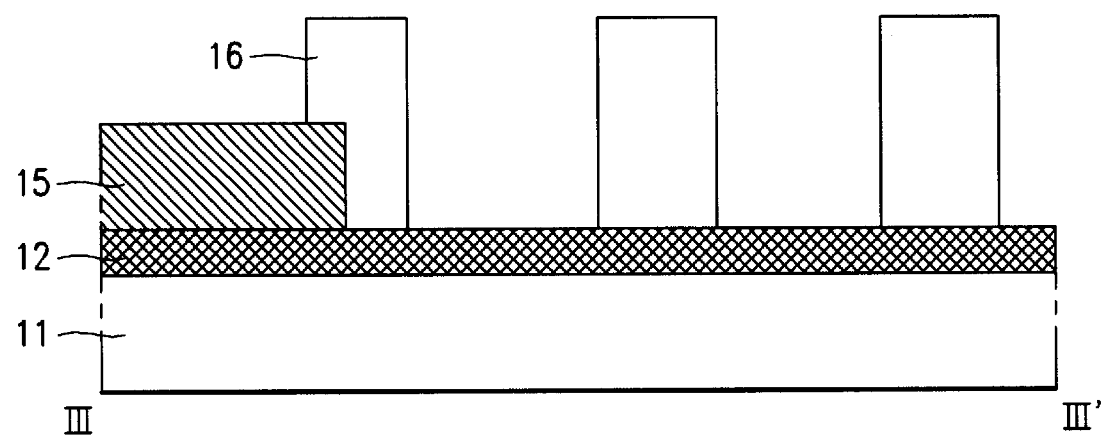
Figure 6E:
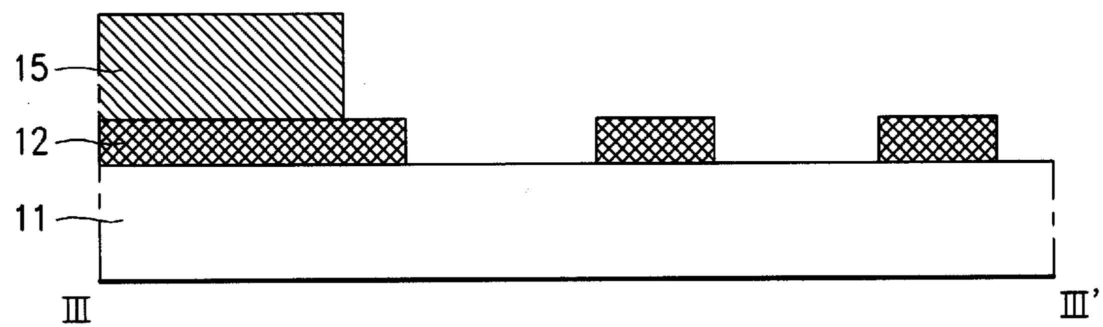

Referring to FIG. 5*a*, a conduction layer for use as a wiring and a sacrificial wiring layer 13 are formed on a substrate 11 in succession. The conduction layer 12 may be formed of polysilicon or a metal, and the sacrificial wiring layer 13 may be formed of an oxide, a nitride, or polysilicon. As shown in FIGS. 4*a*, 5*b* and 6*a*, a first photoresist film 14 is deposited on the sacrificial wiring layer 13, and subjected to exposure and development to form a pattern mask. The photoresist film 14 pattern mask is used in removing the sacrificial wiring layer 13 selectively, to form a virtual wiring. The virtual wiring is formed using the loading effect, not on a region an actual wiring is to be formed, but on a region between the actual wiring to be formed, such that the virtual wiring has a sectional angle close to vertical in regions with a high pattern concentration(regions with a closer gap between the wiring, a section in a short wiring direction) and the virtual wiring has a sectional angle sloped moderately in regions with a low pattern concentration (regions with a coarse gap between the wiring, or end portions of the wiring), and such that the virtual wiring has a vertical sectional angle in the cell array region and the virtual wiring has a sectional angle sloped moderately in the peri region. The loading effect deals with stuffing a space between patterns when an arbitrary layer is stacked in the space; in general, the stuffing is done the better as the pattern concentration is the higher and the arbitrary layer is the thicker. That is, the aforementioned description that the section has an angle close to vertical if the pattern concentration is high and the section has an angle sloped moderately if the pattern concentration is low is come from the nature of stuffing. As shown in FIGS. 4*b*, 5*c* and 6*b*, the first photoresist film 14 is removed, and an insulating film with a high etch selectivity compared to the virtual wiring is deposited on an entire surface, and subjected to anisotropic etching or etch back, to form sidewalls 15 at sides of the virtual wiring. In view of characteristics of the anisotropic etching or the etch back, the sidewalls 15 are formed at sides only with an angle close to vertical, but not with an angle sloped moderately. That is, the sidewalls 15 are formed in the cell array region, but not in the peri region. If the sacrificial wiring layer 13 is formed of an oxide, the sidewalls 15 are formed of a nitride, and vice versa. As shown in FIGS. 4*c*, 5*d* and 6*c*, all the virtual wiring, the sacrificial wiring line 13, is removed. In this instance, if the sacrificial wiring layer 13 is formed of an oxide and the sidewalls 15 are formed of a nitride, the sacrificial wiring layer 13 is removed by wet etching using fluoric acid, and if the sacrificial wiring layer 13 is formed of a nitride and the sidewalls 15 are formed of an oxide, the sacrificial wiring layer 13 is removed by wet etching using phosphoric acid. And, the sacrificial wiring layer 13 may be removed, by, not only wet etching, but also dry etching utilizing a dry etch selectivity difference. As shown in FIGS. 4*d*, 5*e* and 6*d*, a second photoresist film 16 is deposited on an entire surface, and subjected to patterning by exposure and development, to leave the second photoresist 16 only on regions of the pad and peri region pads and other wirings are to be formed thereon. That is, the pad region is at an end portion of the sidewall 15. That is, as explained in the related art, even though a wiring with a micron pattern width is required in the cell array region, since the wiring with a micron pattern width is not required in the pad and peri region, permitting formation of the wiring using exposure in the pad and peri region, a pattern width of the second photoresist film 16 becomes a wiring width. As shown in FIGS. 4*e*, 5*f* and 6*e*, by using the patterned second photoresist film 16 and the sidewalls 15 as masks in removing the conduction layer 12 selectively, and removing the second photoresist film 16, a desired micron pattern can be obtained.

As has been explained, the method for forming a wiring in a semiconductor device has the following advantages.

As sidewalls are formed only on required regions utilizing a difference of angles of etch sections coming from a difference of pattern concentrations in an etching and a wiring is formed by using the sidewalls, formation of a wiring with a micron line width below a resolution limit of exposure is allowed.

It will be apparent to those skilled in the art that various modifications and variations can be made in the method for forming a wiring in a semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming a wiring in a semiconductor device having a cell array region and a peripheral region, the method comprising the steps of:

(1) forming a conduction layer and a sacrificial wiring layer on a substrate in succession;

(2) selectively removing the sacrificial wiring layer to form a virtual wiring line having a sloped end portion;

(3) forming sidewall insulating films at sides of the virtual wiring line excluding the sloped end portion;

(4) removing the virtual wiring line entirely;

(5) forming a mask layer on regions of the pad and peri region pads and other wirings are to be formed thereon; and, (6) using the mask layer and the sidewalls in removing the conduction layer selectively, to form a micron pattern.

2. A method as claimed in claim 1, wherein the conduction layer is formed of polysilicon or a metal.

3. A method as claimed in claim 1, wherein the sacrificial wiring layer is formed of an oxide or a nitride.

4. A method as claimed in claim 1, wherein the virtual wiring line is formed between regions actual wirings are to be formed thereon.

5. A method as claimed in claim 1, wherein the end portion of the virtual wiring line is formed to have the moderately sloped sectional angle by the loading effect.

6. A method as claimed in claim 1, wherein the virtual wiring line is formed in the cell array region, and the sloped end portion thereof is formed to be positioned on the peripheral region.

* * * * *